United States Patent [19]

Dooley et al.

[11] Patent Number: 4,897,150
[45] Date of Patent: Jan. 30, 1990

[54] METHOD OF DIRECT WRITE DESPOSITION OF A CONDUCTOR ON A SEMICONDUCTOR

[75] Inventors: Daniel J. Dooley, Saratoga; Arthur R. Elsea, Jr., Freemont, both of Calif.

[73] Assignee: Lasa Industries, Inc., San Jose, Calif.

[21] Appl. No.: 213,146

[22] Filed: Jun. 29, 1988

[51] Int. Cl.$^4$ ............ H01L 21/306; B44C 1/22; C03C 15/00; C03C 25/06
[52] U.S. Cl. .................... 156/628; 156/643; 156/657; 156/662; 219/121.85; 357/65; 357/71; 437/192; 437/193; 437/233; 437/248; 437/967
[58] Field of Search ............... 156/628, 643, 657, 662; 427/53.1; 437/41, 172, 193, 233, 247, 248, 967; 357/65, 71; 219/121.85

[56] References Cited

U.S. PATENT DOCUMENTS

| | | | |
|---|---|---|---|
| 3,853,648 | 12/1974 | Janus et al. | 156/628 |
| 4,319,954 | 3/1982 | White et al. | 437/233 X |
| 4,358,326 | 11/1982 | Doo | 437/233 X |
| 4,415,383 | 11/1983 | Naem et al. | 437/233 X |
| 4,450,041 | 5/1984 | Aklufi | 156/628 |
| 4,597,160 | 7/1986 | Ipri | 437/41 |

Primary Examiner—William A. Powell
Attorney, Agent, or Firm—Cushman, Darby & Cushman

[57] ABSTRACT

An improved method of patterning a conductive interconnect on a semiconductor element is disclosed. A catalytic layer of, for example, amorphous silicon is deposited on a semiconductor element. The areas over which a conductive pattern is to be formed is activated by directing a focused laser beam onto the amorphous silicon to form crystallized silicon. The amorphous silicon is then etched away after which a conductive material such as a metal is deposited on the activated crystallized silicon.

17 Claims, 1 Drawing Sheet

FIG. IA
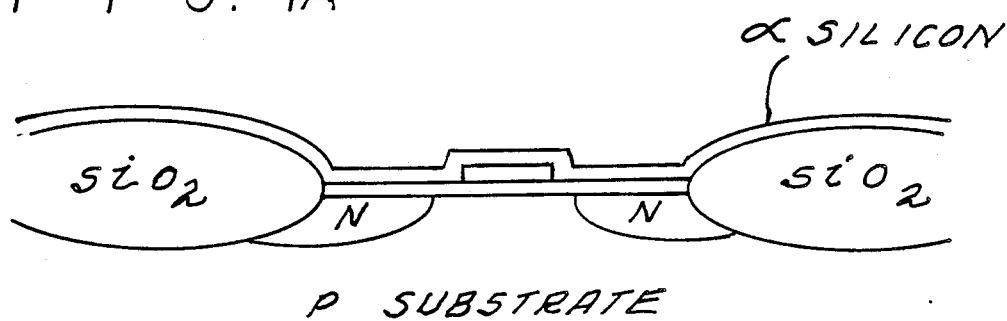
FIG. IB
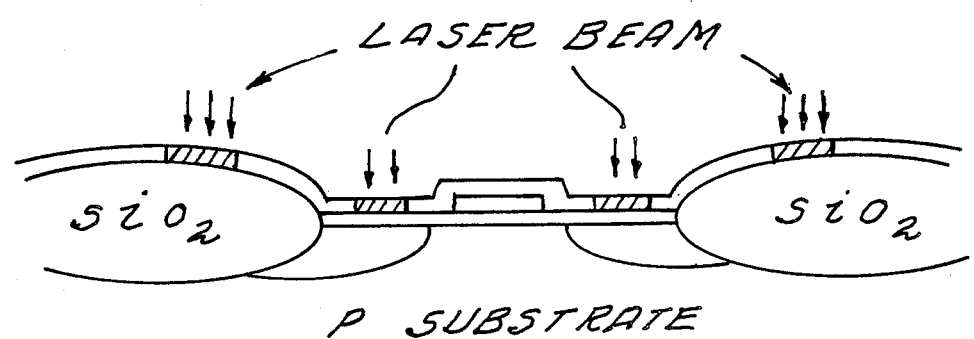
FIG. IC
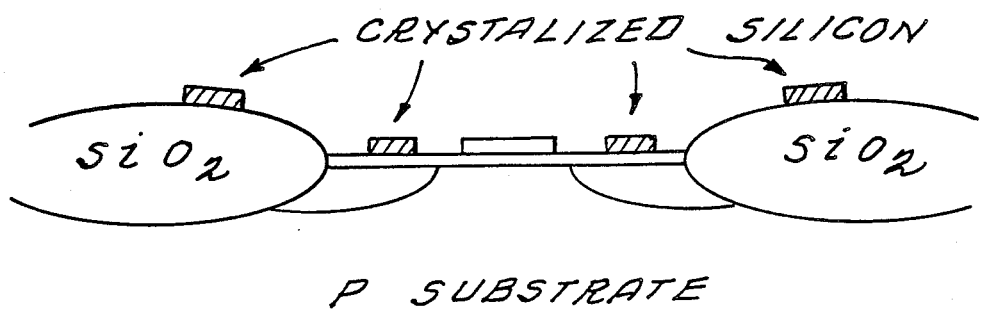
FIG. ID
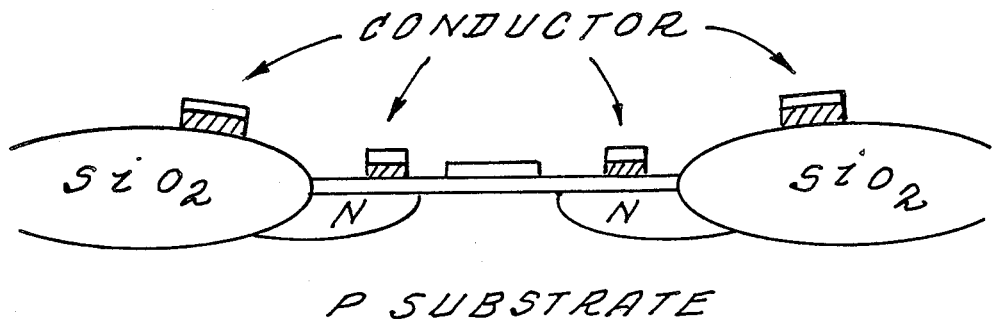

METHOD OF DIRECT WRITE DESPOSITION OF A CONDUCTOR ON A SEMICONDUCTOR

This invention relates to an improved method of patterning a conductive interconnect on a semiconductor material using laser pantography.

Various techniques have been developed for depositing conductive layers such as a metal conductor or a polycrystalline silicon (polysilicon) onto an integrated circuit or other form of semiconductor material for the purpose of forming a circuit interconnect pattern. Conventionally, in mass produced integrated circuits, each of the process steps including the conductive deposition step is performed by batch processing. However, direct write techniques have been developed wherein, for example, an electron beam "writes" a pattern in photoresist on an integrated circuit or other semiconductive element. Some of these prior direct write techniques have also included the use of laser beams. Such laser assisted deposition techniques involve the deposition of metal from a organometallic gas or polysilicon from silane ($SiH_4$) This process is limited by the deposition rate of the metal or polysilicon. Because the direct write process of deposition is a linear process, as opposed to a batch process, the time required for the deposition process is directly proportional to the length of the interconnect or conductor to be deposited. This is a drawback to prior direct write deposition processes. Moreover, accurate control of the sheet resistivite required for high performance circuits has been difficult using prior direct write processes. Moreover, with such prior art laser deposition techniques, it has been difficult to deposit relatively wide conductive patterns.

Accordingly, there is a need in the art for an improved method of forming a conductive pattern on an integrated circuit or other semiconductor element. It therefore is an object of this invention to provide such an improved method.

SHORT STATEMENT OF THE INVENTION

The present invention relates to an improved method of forming a conductive pattern on an integrated circuit or other semiconductor element. In accordance with the invention, a thin layer, for example, 2000 Å, of amorphous silicon is blanket deposited over the surface area of an integrated circuit or other such semiconductor element upon which an interconnection pattern is to be formed. A focused laser beam with sufficient power and having a wavelength of, for example, 5,145 Å, is directed onto the amorphous silicon layer and traverses over the layer to form a pattern for the conductor. The laser beam heats the amorphous silicon in the areas where the deposition of the conductive material is to occur, thereby crystallizing the silicon. Using conventional plasma etching techniques, such as, a conventional plasma etcher employed as the etchant, the uncrystallized amorphous silicon layer is etched away. The etching process is sufficiently select to remove the amorphous silicon layer, yet leave the crystallized patterned silicon on the semiconductor element. The element is then placed in a chamber which preferably is heated in a range of 400°-500° C. in the presence of tungsten hexafluoride ($WF_6$). Tungsten will then be deposited on the recrystallized silicon but not on the portion of the semiconductor element where the amorphous silicon was etched away.

One advantage of the present invention is that the recrystallized patterning technique using a laser beam is quite fast because it is only limited thermodynamically, i.e., by the heat transfer rate, and not by gas dynamics or chemical deposition reaction times. Moreover, the thickness of the tungsten used to interconnect and the resistivity thereof can be accurately controlled by the blanket deposition step rather than by the laser pantography step. In addition, adhesion problems between tungsten and silicon dioxide ($SiO_2$) are eliminated because the patterned crystallized silicon provides excellent adherence of the tungsten thereto.

BRIEF DESCRIPTION OF THE DRAWINGS

Other improvements, advantages and features of the present invention will become more fully apparent from the following detailed description of the preferred embodiment, the appended claims and the accompanying drawings in which:

FIG. 1 (A-D) illustrates a series of steps in accordance with the preferred embodiment of the present invention;

DETAILED DESCRIPTION OF THE PREFERRED EMBODIMENT

Figure 2A:
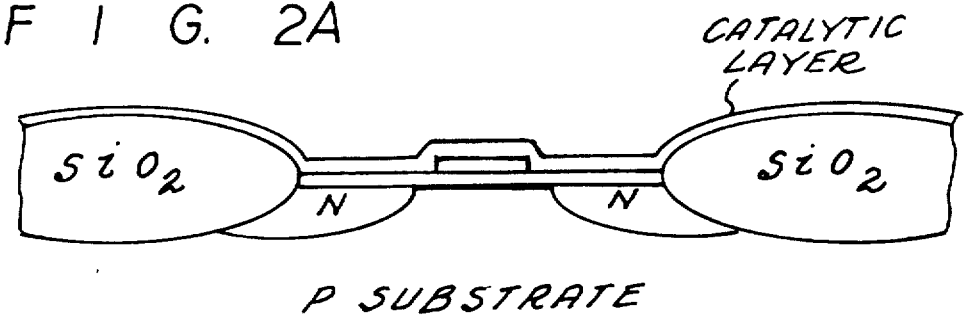
FIG. 2 (A-D) shows a series of steps in an alternative embodiment of the present invention.

Refer now to FIG. 1 which, by way of example, illustrates the preferred embodiment of the present invention. It should be appreciated that the conductive patterning process of the present invention may be utilized in connection with any type of integrated circuit or semiconductive material. By way of example, the invention may be utilized in forming the connections of a gate array or programmable logic array. Regardless of the type of element upon which the pattern is formed, the initial step is to deposit a thin layer of a material which acts as a catalytic layer onto an integrated circuit or semiconductive material. With reference to the figure, the catalytic layer is amorphous silicon and preferably 2000 Å or less.

A focused laser beam illustrated in FIG. 1B having a wavelength of, for example 5,145 Å, heats the amorphous silicon in those areas traversed by the laser beam. This forms the pattern upon which the conductive material will be deposited. The heat of the laser beam activates the amorphous silicon causing the amorphous silicon to be crystallized. Because no deposition has taken place during this pattern formation step, there is no gas dynamic or chemical reaction time limitations. The only time limitation on the rate of formation of the pattern is the heat transfer time required to crystallize the amorphous silicon. It should be appreciated by those skilled in the art that while amorphous silicon is used as the catalytic layer in the present invention, other appropriate materials can be used as desired. It should also be appreciated that while a focused laser beam is utilized to crystallize the amorphous silicon, other suitable techniques could be utilized.

In the subsequent processing steps, as illustrated in FIG. 1C, a blanket etching process using dry etch techniques removes the amorphous silicon, but not the pattern of crystallized silicon formed by the traversal of the laser beam over the semiconductor element. It is a discovery of the present invention that with a typical etch using, for example, $SF_6$, the etching characteristics of crystallized silicon is different from that of amorphous silicon causing a differential rate of etching which is sufficient to leave a pattern of crystallized silicon, whereas the amorphous silicon is completely etched away. It is another advantage of the present invention that there is very little growth of the crystallized pattern region when the laser beam heats the amorphous silicon. This provides for a more accurately formed pattern width for the conductive pattern.

As illustrated in FIG. 1D after the etching step, a blanket deposition of tungsten from tungsten hexaflouride (WF$_6$) takes place. Deposition occurs only on the patterned crystallized silicon regions of the semiconductor element. For example, tungsten can be accurately deposited to a desired thickness which is dependent upon the time duration of the deposition step. Specifically, tungsten will be deposited at a rate of 1200–1500 Å, per minute to complete the pattern forming step.

Dependent upon the integrated circuit to be formed, other steps such as the deposition of a SiO$_2$ layer over the conductive layers may occur, followed by possible other steps as desired.

By the present invention, the width of the conductive pattern can be accurately controlled over a range of anywhere from 1 micron to 50 microns or greater. Because the thickness of the tungsten layer is controlled by the blanket deposition step, it is substantially uniform and accordingly the resistivity of the pattern can be accurately controlled.

Wide conductive pattern lines can be easily formed by repeatedly traversing the laser beam over adjacent areas of the semiconductor element. The crystallized silicon then forms a basis for receiving the tungsten deposition. Adhesion problems between tungsten and SiO$_2$ are eliminated because the tungsten adheres to the patterned crystallized silicon.

Figure 2B:
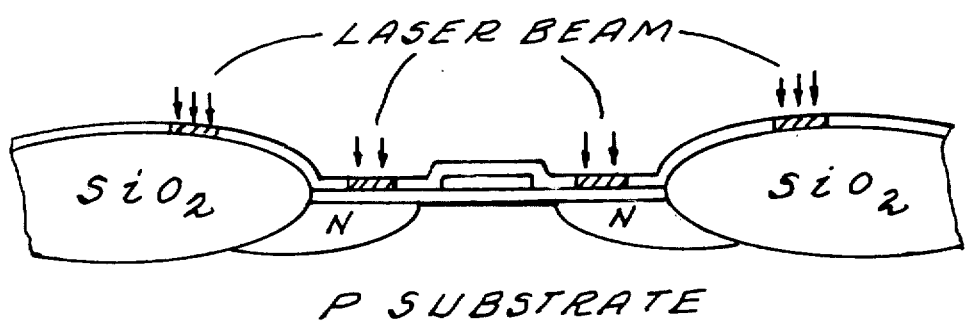
Figure 2C:
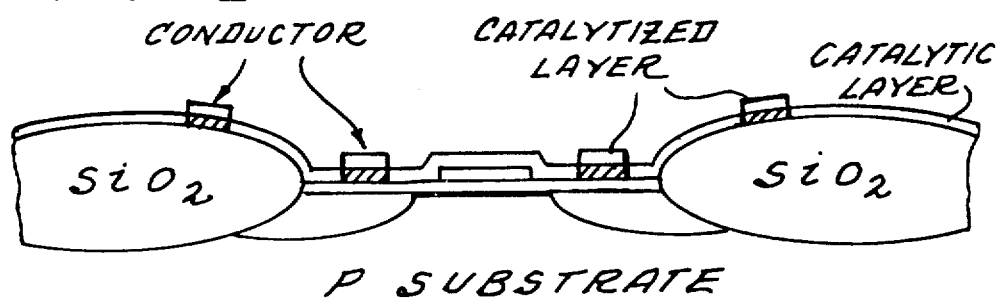
Figure 2D:
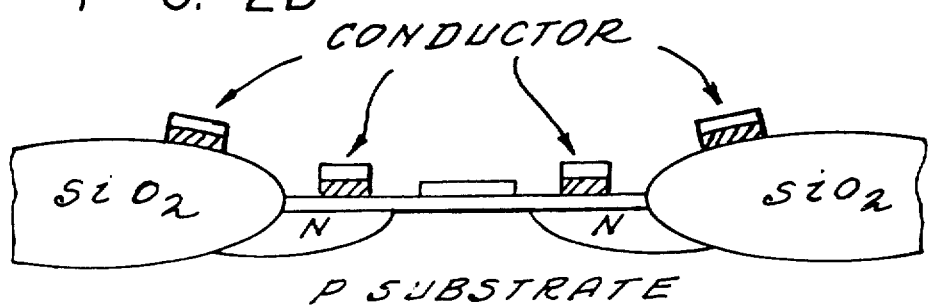

Refer now to FIG. 2 where there is disclosed an alternate embodiment of the present invention. As illustrated in FIG. 2A, the process begins with the blanket deposition of a thin layer of catalytic material. The catalytic layer is then activated as illustrated in FIG. 2B by means of a focused laser beam to form a pattern. The laser beam heats the catalytic layer to activate it over the area of the catalytic layer which the laser beam traverses. With respect to FIG. 2C, instead of an etching step, there is a blanket deposition of the conductive material, such as, a metal, on the activated regions. As aforementioned, this can be performed to a very accurate depth by techniques known in the art. The non-activated regions can next be etched away as illustrated in FIG. 2D to form the desired pattern. This can be followed with a formation of a passivation layer or, as desired, other steps in the formation of the semiconductor element.

While the preferred embodiment has been disclosed in connection with the preferred embodiment thereof, it should be appreciated that other embodiments may be utilized in keeping with the spirit and scope of the present invention as defined by the appended claims.

What is claimed is:

1. A method of forming a conductive pattern on a semiconductor element comprising the steps of:
    depositing a catalytic layer on said semiconductor element;
    activating selected regions of said catalytic layer to form a pattern of activated regions;
    etching the areas of said catalytic layer not activated; and
    depositing a conductive material on said activated regions.

2. A method of forming a conductive pattern on a semiconductor element comprising the steps of:
    depositing a catalytic layer on said semiconductor element;
    activating selected regions of said catalytic layer to form a pattern of activated regions; and
    depositing a selective conductive material over said catalytic layer, a conductive pattern being formed on said semi conductor over said activated regions.

3. A method of forming a conductive pattern on a semiconductor element comprising the steps of:
    depositing an amorphous silicon layer on said semiconductor element;
    selectively heating regions of said amorphous silicon layer to form a pattern of crystallized silicon; and
    depositing a selective conductive material over said amorphous silicon layer including said selected regions to thereby form a conductive pattern on said crystallized silicon.

4. The method of claim 3 wherein said heating step comprises the step of traversing a focused laser beam over the surface of said amorphous silicon to form a pattern of crystallized silicon.

5. The method of claim 4 wherein said amorphous silicon layer is less than about 2000 Å.

6. The method of claim 4 wherein said focused laser beam has a wavelength of about 5,145 Å.

7. A method of forming a conductive pattern on a semiconductor element comprising the steps of:
    depositing a layer of amorphous silicon on said semiconductor element;
    heating selected regions of said amorphous silicon layer to form a pattern of crystallized silicon in said amorphous silicon layer;
    etching the non-crystallized amorphous silicon layer away;
    heating said substrate in the presence of WF$_6$ gas; and
    selectively depositing tungsten on said crystallized silicon regions.

8. The method of claim 7 wherein said heating step comprises the step of traversing a focused laser beam over the surface of said amorphous silicon to form a pattern therein.

9. The method of claim 8 wherein said amorphous silicon layer is less than about 2000 Å, and wherein said substrate is heated to a temperature of between 400° and 500° C. during said heating step.

10. A method of forming a conductive pattern on an integrated circuit element comprising the steps of:
    depositing a thin catalytic layer on said integrated circuit;
    activating selected regions of said catalytic layer to form a pattern of activated regions;
    etching away the areas of said catalytic layer not activated; and
    depositing a conductive material on said activated regions.

11. A method of forming a conductive pattern on an integrated circuit element comprising the steps of:
    depositing selected regions of a catalytic layer to form a pattern of activated regions; and
    depositing a conductive material over said catalytic layer, a conductive pattern being formed on said integrated circuit over said activated regions.

12. The method of claim 11 further comprising the steps of etching away the non-activated catalytic layer, and depositing an insulator layer over said conductive pattern.

13. A method of forming a conductive pattern on an integrated circuit element comprising the steps of:
depositing a thin amorphous silicon a layer on said semiconductor element;
selectively heating regions of said amorphous silicon to form a pattern of crystallized silicon; and
depositing a conductive material over said silicon layer including said selected regions to form a conductive pattern on said crystallized silicon.

14. The method of claim 13 further comprising the step of etching away the non-crystallized silicon layer, said etching step being before or after said conductive deposition step.

15. The method of claim 13 wherein said heating step comprises the step of traversing a focused laser beam over the surface of said amorphous silicon to form a pattern of crystallized silicon.

16. The method of claim 15 wherein said amorphous silicon layer is less than about 2000 Å.

17. The method of claim 15 wherein said focused laser beam has a wavelength of about 5,145 Å.

* * * * *

UNITED STATES PATENT AND TRADEMARK OFFICE
CERTIFICATE OF CORRECTION

PATENT NO. : 4,897,150

DATED : January 30, 1990

INVENTOR(S) : DOOLEY et al.

It is certified that error appears in the above-identified patent and that said Letters Patent is hereby corrected as shown below:

IN THE DRAWINGS:

The sheet of Drawing consisting of figures 2A - 2D should be added as per attached sheet.

Signed and Sealed this

Tenth Day of November, 1992

Attest:

DOUGLAS B. COMER

*Attesting Officer*    *Acting Commissioner of Patents and Trademarks*